United States Patent [19]

Cederbaum et al.

[11] Patent Number: 5,320,975
[45] Date of Patent: Jun. 14, 1994

[54] METHOD OF FORMING THIN FILM PSEUDO-PLANAR FET DEVICES AND STRUCTURES RESULTING THEREFROM

[75] Inventors: Carl Cederbaum, Versailles; Roland Chanclou, Perthes; Myriam Combes, Plaisance-du-Touch; Patrick Mone, Ponthierry, all of France

[73] Assignee: International Business Machines Corporation, Armonk, N.Y.

[21] Appl. No.: 34,325

[22] Filed: Mar. 22, 1993

[30] Foreign Application Priority Data

Mar. 27, 1992 [EP] European Pat. Off. ........ 92480048.5

[51] Int. Cl.$^5$ ...................... H01L 21/70; H01L 27/00
[52] U.S. Cl. ........................................ 437/44; 437/52; 437/59; 257/69; 257/903
[58] Field of Search ................. 437/51, 52, 44, 59; 257/66, 67, 69, 903

[56] References Cited

U.S. PATENT DOCUMENTS

| | | | |
|---|---|---|---|
| 5,157,474 | 10/1992 | Ochii | 257/369 |
| 5,179,033 | 1/1993 | Adan | 437/41 |
| 5,198,379 | 3/1993 | Adan | 437/44 |
| 5,241,193 | 8/1993 | Pfiester et al. | 437/106 |
| 5,241,204 | 8/1993 | Kayma | 257/368 |

FOREIGN PATENT DOCUMENTS

| | | |
|---|---|---|
| 0469215A1 | 7/1990 | European Pat. Off. |
| 4084663 | 3/1989 | Japan ........ 257/69 |
| 3042868 | 2/1991 | Japan ........ 257/69 |

OTHER PUBLICATIONS

IEEE Journal of Solid-State Circuits, vol. 24, No. 6, Dec. 1989, pp. 1708–1713, Ando et al., "A 0.1-μ Standby Current, Ground-Bounce-Immune 1-Mbit CMOS SRAM".
The Jun. 1990 Symposium on VLSI Technology, 4.3, pp. 23–24, M. Kinugawa, et al. "TFT (Thin Film Transistor) Cell Technology for 4Mbit and More High Density SRAMs" 1990.
Solid State Technology, Jan. 1991, pp. 53–56, Nagy et al., "Planarized Inorganic Interlevel Dielectric for Multilevel Metallization—Part I".

Primary Examiner—Olik Chaudhuri
Assistant Examiner—Long Pham
Attorney, Agent, or Firm—H. Daniel Schnurmann

[57] ABSTRACT

A method of forming thin film pseudo-planar polysilicon gate PFETs (pPFETs) simultaneously with bulk PFET and NFET devices in a CMOS or BiCMOS semiconductor structure, comprising the steps of: providing a P-type silicon substrate having a surface that includes a plurality of isolation regions; delineating polysilicon lands at selected isolation regions; forming N-well regions into the substrate at a location where bulk PFETs are to be subsequently formed; forming insulator encapsulated conductive polysilicon studs to provide gate electrodes at desired locations of the structure; forming self-aligned source/drain regions of the bulk NFETs into the substrate; forming self-aligned source/drain regions of the bulk PFETs and pPFETs into the substrate and into the polysilicon lands, respectively; and forming contact regions to the selected locations that include the source/drain regions. In particular, the method finds application in the formation of polysilicon PFETs which are extensively used as load devices in six device (6D) SRAM cells.

8 Claims, 10 Drawing Sheets

METHOD OF FORMING THIN FILM PSEUDO-PLANAR FET DEVICES AND STRUCTURES RESULTING THEREFROM

FIELD THE INVENTION

The present invention relates to a method of manufacturing semiconductor devices, and more particularly to a method of simultaneously forming thin film pseudo-planar polysilicon PFET devices and bulk FET devices in CMOS or BiCMOS semiconductor chips. The present invention also relates to the semiconductor structures resulting thereof.

BACKGROUND OF THE INVENTION

Until recently, polycrystalline silicon (polysilicon) resistors have been commonly used as load devices in Static Random Access Memories (SRAMs). Stacking polysilicon load resistors above NFETs in the so-called 4D/2R SRAM cells has been advantageously used in the layout of SRAM chips. Devices of this type commonly have the NFETS determine how much real estate is to be consumed, which in turn, determines the cell area. By doing so, a significant reduction in size of the SRAM cell can be achieved. The load resistors of such SRAM cells are formed by resistive polysilicon lands provided by a very thin film or layer of either intrinsic or lightly doped polysilicon. However, because these load resistors must be fairly high-valued, e.g., in the tera-ohm (10E12) range or higher, in order to decrease the current drawn by the cell, the capacity of such SRAM cell chips appears to be limited to 1-Mbit. Beyond this range, the polysilicon layer is so thin that the process tolerances become too difficult to control. In addition, SRAM cells provided with load resistors are highly sensitive to soft errors produced by alpha particles and cosmic rays. Thus, beyond this limit, PFETs that are resistively connected have to be used as load devices instead of polysilicon resistors, in spite of a higher cost and a significantly more complex manufacturing process.

Figure 1:
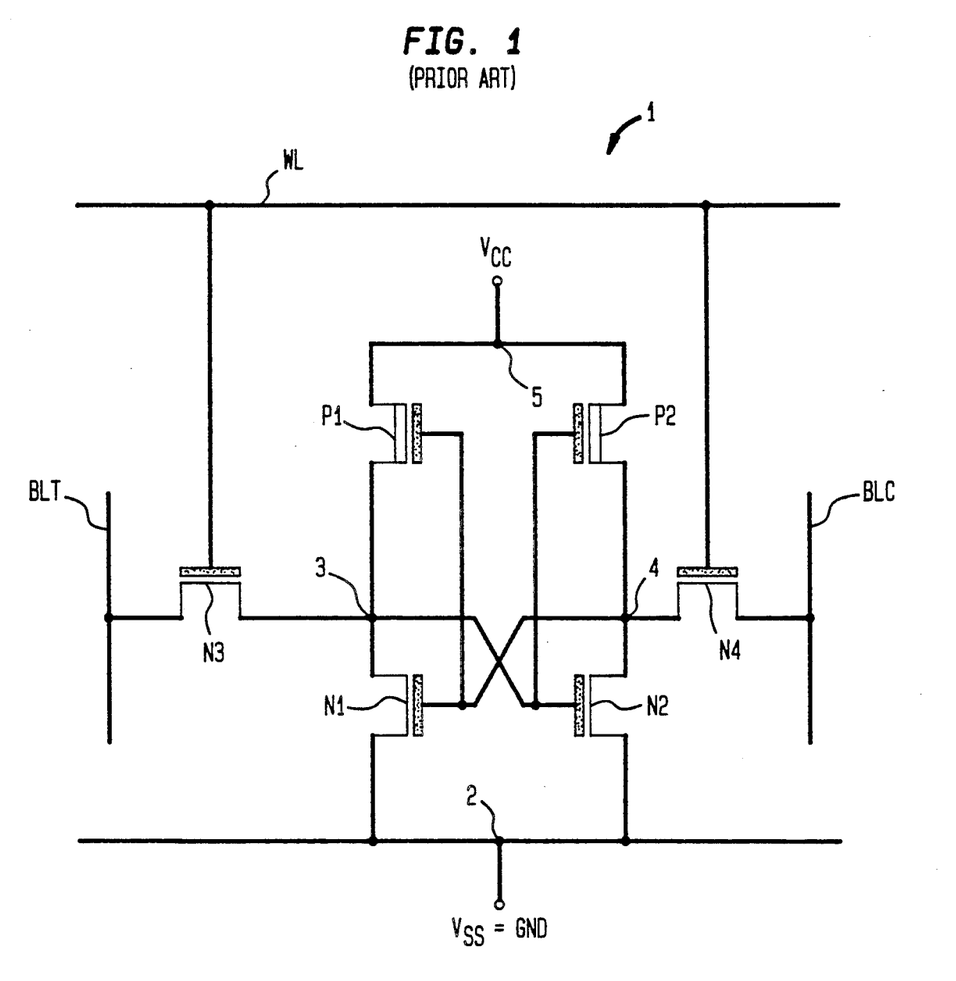
FIG. 1 is a diagram showing a conventional 6D SRAM cell circuit including two PFETs as load devices.

FIG. 1 shows a conventional 6D SRAM cell circuit (referenced 1) with PFETs as load devices. Two cross-coupled NFETs N1 and N2, so-called driver transistors, are connected between common node 2 connected to a first supply voltage $V_{SS}$ (usually ground, Gnd) and respective nodes 3 and 4, so-called charge storage nodes. Nodes 3 and 4 are in turn connected to a common node 5 tied to a second supply voltage (most commonly, a positive voltage $V_{CC}$), respectively, through PFETs P1 and P2. On the other hand, nodes 3 and 4 are also, respectively, tied to bit lines BLT and BLC through NFETs N3 and N4, so-called access transistors. The gate electrodes of NFETs N3 and N4 are attached to the word line WL for READ and WRITE operations.

In view of the complexity of storage nodes 3 and 4, dense CMOS SRAM cells may be obtained in a great variety of manners. For instance, referring to the article entitled: "A 0.1 μA stand-by current ground-bounce-immune 1-M bit CMOS SRAM" by M. Ando et al, published in the IEEE JSSC Vol. 24, N° 6, Dec. 89, pp. 1708-1713, the use of stacked polysilicon gate PFETs (sPFETs) is described, wherein NFET N1 and PFET P1 share the same gate electrode. This technique combined with a 0.8 μm twin-well CMOS process results in a small memory cell size of 41 μm². The advantages and disadvantages of this approach are analyzed in the European Patent EP-A-90480109.9, filed on 31 July 1990, and of common assignee.

Figure 2:
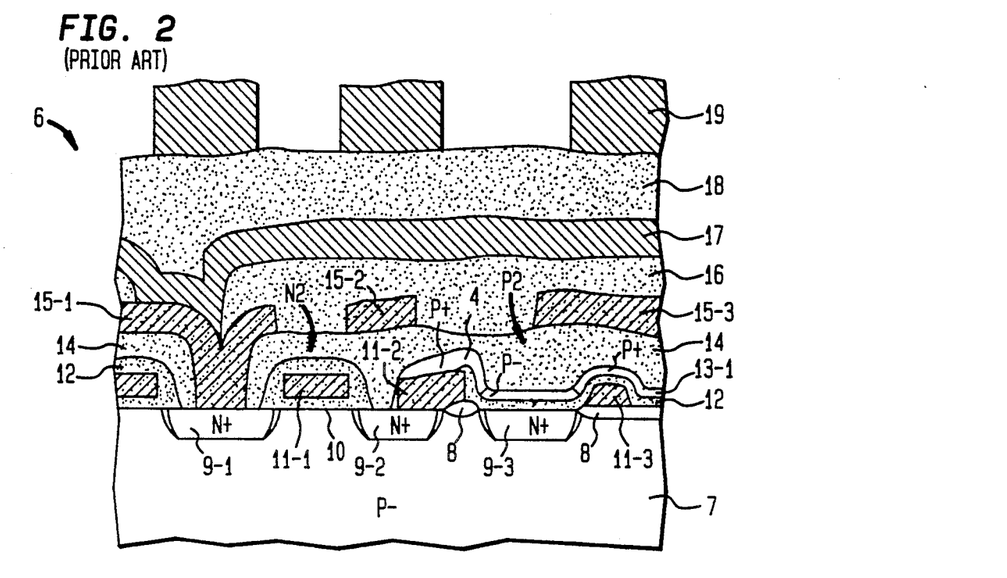
FIG. 2 is a cross-section view (partially broken away of the structure) of the 6D SRAM cell circuit of FIG. 1 when it is integrated in a silicon substrate, according to a conventional CMOS FET process of manufacturing thin-film inverted polysilicon gate PFET devices (iPFETs)

Another technique which takes advantage that NFET N1 and PFET P2 have their respective drain region and gate electrode at the same potential, is described in the article entitled: "TFT cell technology for 4M bit and more high density SRAMs" by M. Kinugawa et al, published in the IEEE 1990 Symposium on VLSI Technology 4.3, pages 23-24. FIG. 2 of the present application reproduces FIG. 7 of this article. It shows a partial cross-section view of the 6D SRAM cell circuit of FIG. 1, when it is integrated in a semiconductor substrate according to the CMOS manufacturing process described therein. The PFETs used as load devices, and fabricated with this thin-film manufacturing process will be referred henceforth as iPFETs, because of their upside-down or inverted design. The structure 6 is a good example of the most advanced state of the art known to date claiming a memory cell size of 20.3 μm², for a 0.5 μm CMOS process. In FIG. 2, numeral 7 indicates the P type silicon substrate. Numerals 8 indicate the different field recess oxide (ROX) regions that are used to isolate the various active regions of the structure. Numerals 9 are generically active N+ implanted source and drain regions of the NFETs, although some of these regions can also be used as gate electrodes for the iPFETs.

FIG. 2 refers, more particularly, to the FET devices N2 and P2 shown in FIG. 1. Numeral 10 indicates the gate dielectric layer, typically an $SiO_2$ layer, which forms the gate dielectric of the bulk FET devices, i.e., the NFETs and PFETs formed in the substrate by the CMOS manufacturing process. The tungsten polycide layer 11 results from alloying highly doped N+ polysilicon with tungsten. Layer 11 is patterned to delineate the gate electrodes of the bulk FET devices. Gate electrodes of NFETs N2 and N1, respectively referenced 11-1, 11-2, and 11-3, designate the gate electrode of a non-referenced FET device in FIG. 1. Gate electrode 11-2 forms a buried contact with region 9-2 which becomes the drain region DN2 of NFET N2. $SiO_2$ layer 12 forms the gate dielectric of the iPFETs and coats gate electrodes 11-1, 11-2 (partially) and 11-3. N+ doped region 9-3 plays both the role of the gate electrode GP2 of iPFET P2 (oxide layer 12 is the gate dielectric thereof) and the drain region DN1 of NFET N1. A polysilicon land 13-1 coats gate electrodes 9-3 and 11-3, and, is isolated therefrom by an $SiO_2$ layer (12). Polysilicon land 13-1 results from the patterning and selective doping of a lightly P-doped polysilicon layer 13 (the doping is performed by adjusting the voltage threshold VT of the iPFETs) that was deposited and recrystallized to form the body of the iPFETs. As apparent from FIG. 2, this polysilicon land 13-1 is highly doped with a P-type dopant except on the region 9-3 just above N+. The lightly doped portion of land 13-1 forms the channel region of the iPFET P2, while the adjacent highly P+ doped regions form the source and drain regions thereof, respectively referred to as SP2 and DP2. An extension of the drain region of iPFET P2 in polysilicon land 13-1, referred henceforth as the extended drain region EDP2, contacts the small portion of gate electrode 11-2 which is exposed through an opening in the oxide layer 12. More generally, an oxide layer 12 is opened for each cell, at all locations where it is required to make contact between the N+ doped polysilicon gate electrode of a NFET and the adjacent P+ extended drain region of the corresponding iPFET. Note that N+ region 9-2, gate electrode 11-2 of NFET N1 and the extended drain region of iPFET P2 in land 13-1, are at the source potential of node 4, thereby achieving the desired cross-coupling of the devices, as illustrated in the cell circuit of FIG. 1. At this stage of the process, the structure is said to have completed the Master Slice processing steps of a polysilicon gate CMOS FET technology, i.e., the bulk and thin-film FET devices have been fabricated in the substrate. The structure is passivated by a relatively thick insulating $SiO_2$ layer 14 of about 500 nm. As such, the structure completes the FEOL (Front End Of the Line) processing.

Elements that will now be described are formed during the personalization steps or BEOL (Back End Of the Line) processing. Tungsten polycide lands 15-1, 15-2 and 15-3 result from patterning a tungsten polycide layer 15. Referring to FIG. 2, the polycide land 15-1, which connects an N+ active region 9-1 (the source region of NFET N2) to ground will be referred to hereinafter as the Gnd bus. An additional insulating $SiO_2$ layer 16 completes the structure. The insulating layer 16 is provided with contact openings to allow appropriate contacting of metal bit lines BLT and BLC with the power busses (e.g., the $V_{CC}$ power bus) that are obtained after patterning an aluminum-silicium (Al-Si) layer 17. The structure is passivated with $SiO_2$ layer 18. An additional second aluminum layer 19 is shown on top of the structure. All succeeding layers, in particular polysilicon layer 13, are conformally deposited. As a result, the upper layers of structure 6 display a typical "corrugated" or "castellated" relief aspect.

The cell construction of FIG. 2, wherein the iPFETs are used as load devices is of great interest in terms of density, in view of the fact that the cell area is substantially determined by the area of the bulk NFETs. However, the semiconductor structure and corresponding manufacturing process disclosed present major disadvantages which are recited hereinafter, and which result in significant potential problems.

1. In order to manufacture the structure of FIG. 2, six additional masks are required with respect to a conventional manufacturing process of 6D SRAM cell chips not offering iPFETs in the menu. The first mask is used to partially remove the gate oxide layer 10 above the source region 9-2 of NFET N2, which establishes a buried contact between gate electrode 11-2 and region 9-2. The second mask provides an opening in layer 12 above gate electrode 11-2. The third mask is used to pattern the P-type lightly doped polysilicon layer 13 to shape the desired polysilicon land 13-1, wherein the body of iPFET P2 and its related extended drain region (for connection with underlying gate electrode 11-2) are formed. The fourth mask is a block-out mask that is required to protect the channel region of iPFET P2 body from the implant of P-type dopants to form the highly doped P+ source and drain regions thereof. An extended drain region is formed at this stage of the process. The fifth mask defines contact openings in layer 14 where polycide lands, e.g., 15-1, to convey the Gnd potential, and establish contact with source regions 9 of selected NFETs, e.g., the source region SN2 of NFET N2 (FIG. 2). Finally, the sixth mask delineates the polycide lands, e.g., 15-1, the word lines and power busses.

2. Region 9-3 is the drain region DN1 of NFET N1 and the gate electrode GP2 of iPFET P2. Thus, the layouts of these two devices are strongly interdependent both in terms of device size and device layout which, in turn, results in less flexibility in their respective design. More generally, since the width of diffusion regions 9-1, ... of the driver NFETs, e.g., N1, must be at the minimum allowed by the technology for maximum density, the gate length of the iPFETs, e.g., P2, is thus determined. This constitutes a potential source of reliability hazards. In particular, if the out-diffusion of the P+ dopants contained in the implanted source and drain regions of iPFET P2 is not well controlled, the source and drain regions SP2 and DP2 become too large, thereby reducing the effective channel length of iPFET P2. As a result, punch-through problems can sometimes occur. The channel length of iPFET P2 cannot be increased (if maximum density is sought) since this length is dictated by the performance requirements of NFET N1.

Figure 3A:
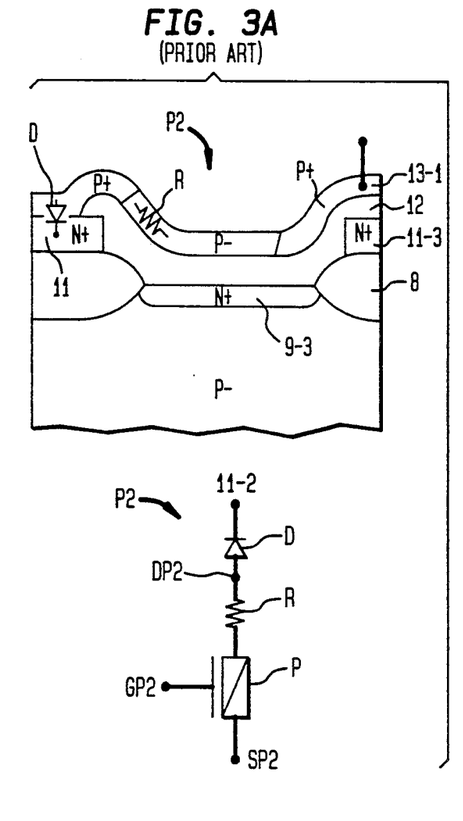
FIGS. 3A and 3B show an enlarged view of the iPFET device structure of FIG. 2 that illustrate the parasitic resistor introduced therein, with depending positive or negative mask misregistration.
Figure 3B:
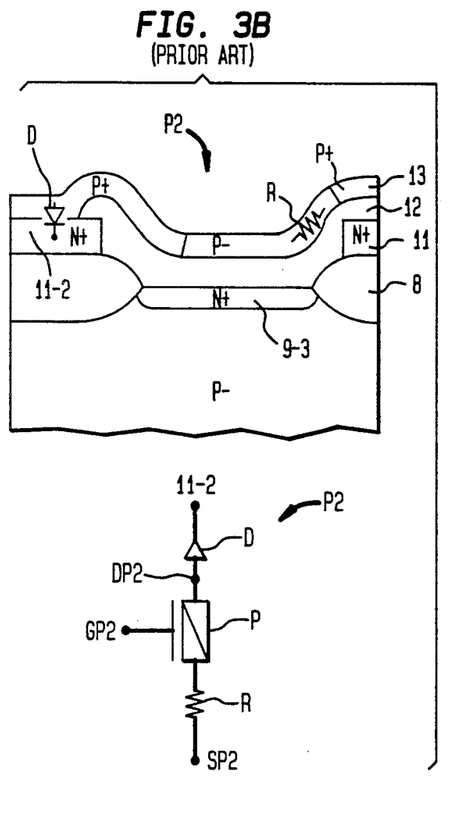

3. The structure of iPFET P2 illustrated in FIG. 2 is upside-down, thus self-alignment registration (SAR) is not possible. Since the block-out mask defining the channel region of iPFET P2 is at the minimum image size, alignment tolerance between this block-out mask and the channel region can result in a channel region not correctly aligned with the gate electrode. FIGS. 3A and 3B are enlarged views of the portion of structure 6 which more particularly shows iPFET P2, and which illustrates the effect of such a misalignment on the electrical characteristics thereof. This effect mainly consists in a parasitic resistor added to an ideal PFET P that would have been obtained if no misregistration had existed. This effect will now be explained in more detail. For both cases (positive and negative misalignment) shown in the upper part of FIGS. 3A and 3B, a high value resistor R is placed in series with the drain or source region of the ideal PFET P. This is illustrated in the lower part of FIGS. 3A and 3B, wherein a schematic of the electrical is shown. This parasitic resistor decreases the effective gate to source overdrive voltage (VGS-VT) of iPFET P2 (which has already a high threshold voltage VT) and hence also decreases its "ON" current. Finally, in the case of misalignment, the iPFET P2 is far from an ideal PFET P. Additionally, due to their upside-down construction, iPFETs cannot be provided with improved source/drain structures such as LDD (Lightly Doped Drain). This potentially may be a problem, because the effective length of the iPFETs is highly sensitive to the source/drain dopant out-diffusion as was previously mentioned, and which is admittedly difficult to maintain low in polysilicon.

4. Since the iPFETs are formed after the bulk devices have been completed, the thermal budget necessary to polysilicon recrystallization and source/drain dopants reactivation must be kept to a low. This limitation is necessary to minimize the impact of these steps on the bulk FET devices and on the underlying tungsten polycide layer forming gate electrodes 11-1, ... It is also a further limitation on improving the iPFET performance.

5. The gate electrode of the iPFET P2 has no optimized work function. Since the iPFET P2 gate electrode is formed by the N+ drain region of a driver transistor, e.g., NFET N1, there is no flexibility in selecting the type of conductivity of the gate electrode. The gate electrode of the iPFET is N+ type, whereas P+ type would have been preferred. It is well recognized that this situation creates punch-through problems. In particular, punch-through effects induce leakage currents which are critical to the standby power consumption of the SRAM cell.

6. As previously mentioned in conjunction with FIG. 2, the conventional manufacturing process results in a non planarized structure 6. The gate oxide layer 12 and the polysilicon layer 13 forming iPFET P2 are deposited over the "castellated" topology of gate electrodes 11-1, 11-2, 11-3, . . . albeit slightly smoothed by the SiO2 layer 12. A non-planar topology causes reliability problems, known as "step coverage", caused by a polysilicon layer 13 which is much thinner than the polysilicon layer 11 forming the gate electrodes.

7. A parasitic P+/N+ diode (referenced D) in FIGS. 3A and 3B is formed between the N+ gate electrode 11-2 of NFET N1 and the P+ extended drain region of iPFET P2. This diode degrades the quality of the contact, which is no longer of an ohmic type, thereby slowing down the overall performance of the SRAM cell.

8. The power busses and possibly the local interconnect scheme that makes straps and short distance connections at the silicon wafer level, are all made of polycide. Tungsten polycide is a good conductive material and is known to exhibit higher resistivity than metals.

The above cited problems are favorably resolved by the manufacturing method of the present invention and the resulting integrated circuit structures thereof.

SUMMARY OF THE INVENTION

The manufacturing method used to produce the semiconductor structures comprises the steps of:
a) providing a P-type silicon substrate having a surface that includes a plurality of isolation regions;
b) delineating polysilicon lands at selected isolation regions;
c) forming N-well regions into the substrate at a location where bulk PFETs are to be subsequently formed;
d) forming insulator encapsulated conductive polysilicon studs to provide gate electrodes at selected locations of the structure;
e) forming self-aligned source/drain regions of the bulk NFETs into the substrate;
f) forming self-aligned source/drain regions of the bulk PFETs and pPFETs into the substrate and into the polysilicon lands, respectively; and
g) forming contact regions to the selected locations that include the source/drain regions.
h) exposing the top of certain polysilicon studs;
i) blanket depositing an etch stop layer onto the structure;
j) forming an insulating matrix provided with openings onto the structure exposing desired locations of the underlying etch stop layer;
k) etching the exposed regions of the etch stop layer; and
l) filling the openings of the matrix with conductive material to form contact studs.

In another alternate embodiment, the method includes prior to step h) the step of:

m) forming an etch stop layer over selected polysilicon studs and selected regions of the substrate to facilitate the subsequent formation of overpass conductors.

OBJECTS OF THE INVENTION

It is therefore a primary object of the present invention to provide a method of forming thin film pseudo-planar polysilicon gate PFETs as load devices in 6D SRAM cells with a reduced number of additional masking steps with respect to a standard CMOS manufacturing process.

It is another object to provide a method of forming thin film pseudo-planar polysilicon gate PFETs as load devices in 6D SRAM cells that is independent of NFET device size and layout, thereby avoiding potential punch-through problems.

It is still another object to provide a method of forming thin film pseudo-planar polysilicon gate PFET devices in 6D SRAM cells that include LDD and SAR features, thereby eliminating problems resulting from misregistration.

It is a further object to provide a method of forming thin film pseudo-planar polysilicon gate PFETs as load devices in 6D SRAM cells that have no thermal budget constraints.

It is still a further object to provide a method of forming thin film pseudo-planar polysilicon gate PFETs as load devices in 6D SRAM cells, wherein the gate electrodes of the devices are made of P+ polysilicon for an adequate work function.

It is a more particular object to provide a method of forming thin film pseudo-planar polysilicon gate PFETs as load devices for 6D SRAM cells, wherein the PFETs are formed on planar isolating surfaces for better reliability.

It is yet a further object to provide a method of forming thin film pseudo-planar polysilicon gate PFETs as load devices in 6D SRAM cells, wherein no parasitic diodes are produced on the contacts, for better performance.

It is still another object to provide a method of forming thin film pseudo-planar polysilicon gate PFETs as load devices in 6D SRAM cells, wherein word lines, power busses and local interconnect straps are formed of metal for improved conductivity.

When compared to the prior art described in conjunction with the structure of FIG. 2, the method of forming thin film pseudo-planar polysilicon PFET (pPFET) devices for 6D SRAM cells and the structures resulting from the present invention have definite advantages that are recited hereinafter:

1. Only three or four additional masks are required; in the latter case, the method allows implementing useful overpass conductors.
2. The pPFET size and layout are independent of the underlying bulk NFET size and layout.
3. The pPFET benefits from the engineering done for bulk FET devices, e.g., the source/drain are self-aligned with the gate electrode, thereby obtaining LDD structures. Finally, a short channel length is achievable in spite of the fast out-diffusion of dopants in polysilicon.
4. No constraint on thermal budget associated with the pPFET exists since the polysilicon layer forming the "body" thereof is deposited and recrystallized prior to the process steps necessary to fabricate the bulk FET devices. On the other hand, the source/drain dopants reactivation of the pFETs is simultaneously performed with the bulk FET devices.

5. The pPFET is controlled by a tungsten polycide gate electrode for optimized work function.
6. The pPFET is formed onto a planarized surface.
7. The N+/P+ diode contact structure is replaced with a tungsten contact stud which provides excellent ohmic contact.
8. Word lines WL, Gnd and $V_{CC}$ power busses, and local interconnect conductors are made of metal instead of tungsten polycide.

BRIEF DESCRIPTION OF THE DRAWINGS

The novel features believed to be characteristic of this invention are set forth in the appended claims. The invention itself, however, as well as other objects and advantages thereof, may best be understood by reference to the following detailed description of an illustrated preferred embodiment to be read in conjunction with the accompanying drawings, in which:

DESCRIPTION OF THE INVENTION

A preferred embodiment of the method of the present invention will be described with reference to FIGS. 4A to 4Z which illustrate a silicon wafer undergoing the various steps of a CMOS process, in which bulk PFETs and NFETs for 6D SRAM cells are fabricated with pFETs as load devices.

Figure 4A:
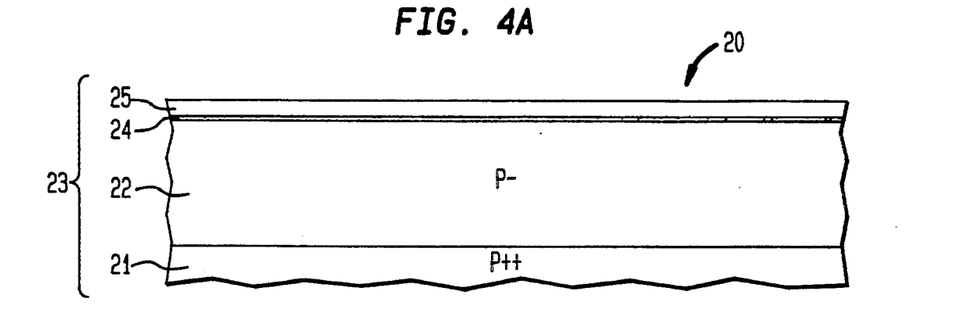
FIGS. 4A to 4Z illustrate a sequence of processing steps in accordance with a preferred embodiment of the present invention.

Referring to FIG. 4A, a structure (20) at the initial stage of the manufacturing process is illustrated.

1. A P++ layer 21 is deposited on top of a 2 $\mu$m thick P− epitaxial layer 22 thereby forming the starting substrate 23. The surface of this substrate is coated with a lower 14.5 nm thick $SiO_2$ layer 24 and a top 160 nm thick $Si_3N_4$ layer 25.

Figure 4B:
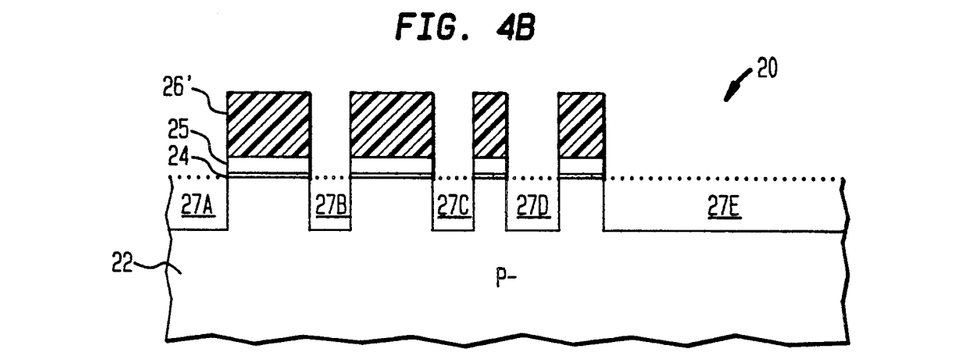

2. A 1.3 $\mu$m thick photoresist layer 26 is applied onto the initial structure 20 of FIG. 4A. It is exposed and developed to provide the desired masking pattern 26'. The exposed areas of the composite $Si_3N_4/SiO_2$ layers 24/25 and the underlying epitaxial layer 22 are then etched in AME 5000 equipment using a $NF_3/N_2/He$ gas composition. As a result, shallow isolation trenches 27, approximately 600 nm deep, are formed on the epitaxial layer 22. Both narrow (e.g., 27B) and large (e.g., 27E) trenches are defined. The resulting structure is shown in FIG. 4B.

Figure 4C:
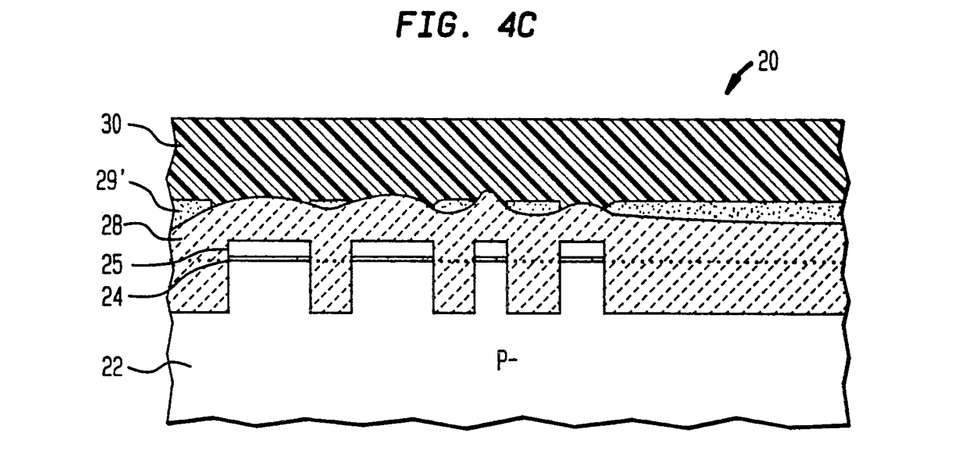

3. The remaining photoresist mask 26' is stripped off by ashing in the same AME 5000 equipment in an $O_2$ atmosphere. The wafer is then cleaned in a $SO_4H_2/H_2O_2$ solution. Trenches 27 are filled with oxide for isolation purposes. To that end, a very thin (e.g., 45 nm) thermal oxide layer (not shown) is first grown on the trenches. Next, the trenches are filled with TEOS (Tetra Ethyl Ortho Silicate) oxide by depositing a blanket 850 nm thick TEOS layer 28 (by LPCVD) over the entire wafer surface. As apparent from FIG. 4C, layer 28 is deposited conformally, i.e., by filling up the trenches 27. Although the TEOS layer 28 is thicker than the trench depth, the TEOS coating exhibits a non-planar surface with protrusions or hillocks between the trenches. As a result, the wafer surface needs to be planarized. A good planarizing medium, e.g., a photoresist with the same etch rate ratio as the TEOS and with adequate viscosity, of a type similar to the standard etch-back process such as described in U.S. Pat. No. 4541168 could be used. Preferably, steps which aim at compensating for surface irregularities should be used. Still referring to FIG. 4C, a 0.760 $\mu$m thick photoresist layer 29 is applied to the structure, exposed, developed and baked at 190° C. Appropriate photoresists that can be used in the present method include Merck EM3100 and the like. The mask 29' that is produced is not to delineate the standard underlying layer, but to coarsely fill cavities above the trenches. Next, the above mentioned planarizing medium is applied onto the structure to form layer 30 with a thickness of 0.830 $\mu$m then, baked at 130° C. The structure at this stage of the process is shown in FIG. 4C. More details concerning this planarization technique can be found in the article published in Solid State Technology, of January 1991, pp. 53–56, "Planarized inorganic interlevel dielectric for multilevel planarization" by A. Noggy et al.

Figure 4D:
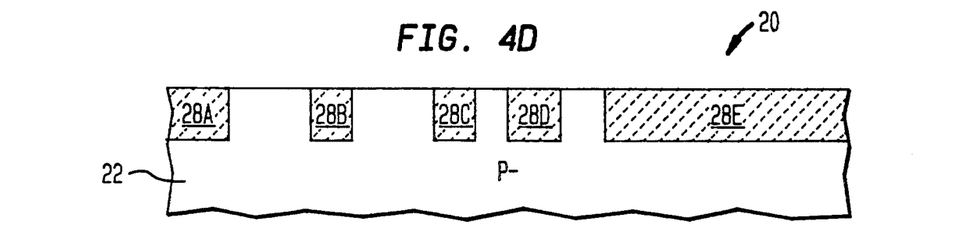
Figure 4E:
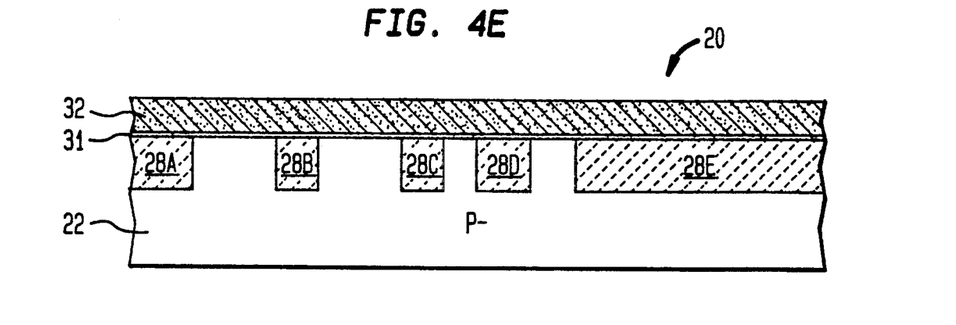

4. The structure is now subjected to RIE etch-back using a $NF_3/CHF_3/CO_2$ mixture in order to remove the protrusions in the TEOS layer 28. Since there is no etch-stop layer, the etch-back step is carefully monitored to stop just slightly above the pad nitride layer 25. In order to reach a mirror-quality of the structure top surface, the structure 20 is chem-mech polished. The TEOS oxide layer 28 is polished down to the nitride layer 25 (which acts as the etch stop layer) in a chem-mech Westech polisher. As a result, damage due to previous RIE etching is removed. The wafer is then annealed at 1000° C. in an argon atmosphere to densify the oxide fill. Next, the pad oxide composite layer 24/25 is removed. The $Si_3N_4$ pad layer 25 is first eliminated in $H_3PO_4$ at 165° C., and then, the $SiO_2$ pad layer 24 is stripped off by dipping it in diluted HF (10:1). The final structure is shown in FIG. 4D, wherein the isolation regions or islands formed by the densified TEOS oxide fills in the trenches 27 are generically referenced 28.

5. As apparent from FIG. 4E, the process continues with the formation of a sacrificial $SiO_2$ layer 31, having a thickness of 22.5 nm that is grown at 800° C., followed by the deposition of a 100 nm thick polycrystalline silicon layer 32, (e.g., by LPCVD at 560° C. in a SVG equipment or in a CVD ASM EPSILON equipment). Alternatively, TEOS may be used instead of $SiO_2$ to form layer 31 and increase silicon nucleation site density. The polysilicon layer 32 is amorphized by implanting silicon ions therein (which is not required if amorphous silicon is deposited). The amorphized polysilicon material of layer 32 may be recrystallized at this stage, although preferably at a later stage. This step is completed at 600° C. during 10 hours, to reach a grain size of 3-5 μm.

Figure 4F:
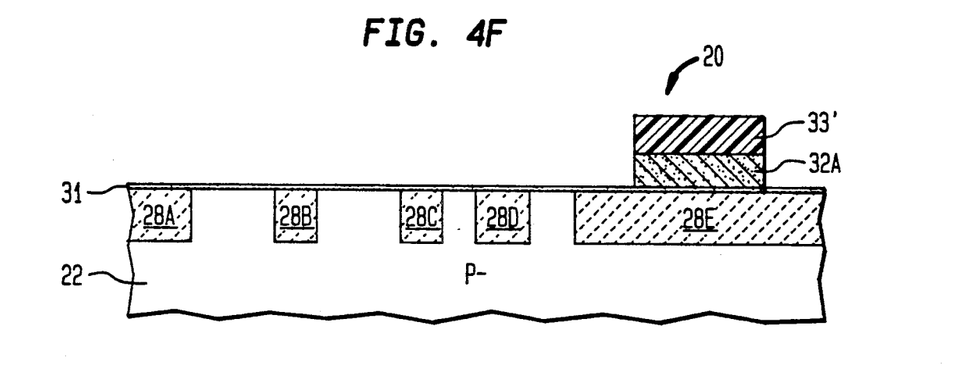

6. The polysilicon layer 32 is now patterned to delineate the polysilicon lands. These are subsequently required to define the body of the pPFETs of the present invention. To that end, a photoresist layer 33 (0.6 μm thick) is applied onto the structure appropriately exposed and developed to form an in situ mask 33'. The exposed areas of the polysilicon layer 32 are etched using a $Cl_2/HCl$ gas mixture. The structure 20 with one polysilicon land (32A), formed above large oxide island (28E), is illustrated in FIG. 4F. Next, the photoresist mask 33' is removed. The wafer is then cleaned in a sulfuric/peroxide solution. Preferably, the recrystallization step just mentioned is completed. Because of the limited size of lands 32A, the polysilicon lands may even become monocrystalline during the recrystallization step, i.e., in each land, e.g., land 32A, the polysilicon material recrystallizes to form a single grain. This results in a pPFET having an acceptable performance. Finally, the voltage threshold of the pPFETs is adjusted by a blanket ion implantation of phosphorous dopants in the polysilicon lands. It is important to notice, that unlike the conventional process disclosed in Ref. 2, recrystallization of polysilicon material is completed at a stage (i.e., at step 5 or 6) where the bulk FET devices have not yet been formed. However, for the reasons given above, it is recommended to have recrystallization completed in the present step.

Figure 4G:
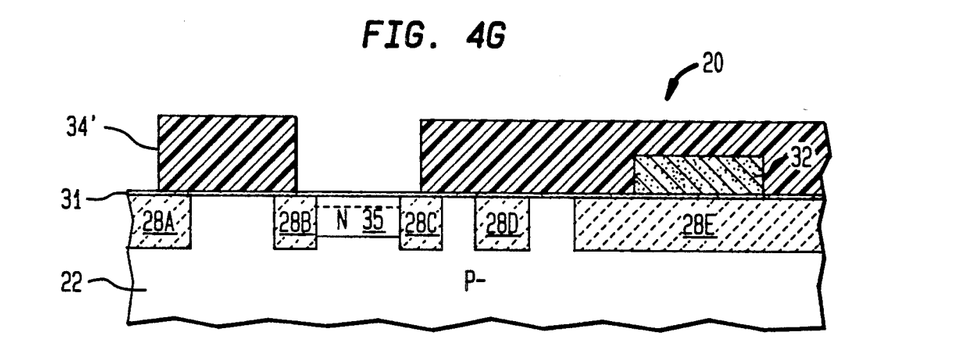

7. Referring to FIG. 4G, a new 2 μm thick photoresist layer 34 is deposited onto the structure, exposed and developed. The mask defines the N-wells. A two-step ion implantation is then conducted to introduce phosphorous P+ dopants in the exposed portions of the epitaxial layer 22 to convert the surface regions thereof into N type regions. These regions are then used as N-wells for bulk PFETs, as it is known to those skilled in the art. By way of example, P+ ions are first implanted at a dose of 3E13 at/$cm^2$ and energy of 850 KeV, followed by a dose of 2E12 at/$cm^2$ and energy of 195 KeV. At this stage of the process, the voltage threshold VT of the bulk PFETs is adjusted by implanting $BF_2+$ ions in the N-well regions, at a dose of 3E12 at/$cm^2$ and energy of 50 KeV. As apparent from FIG. 4G, the structure 20 is now provided with an N-well region 35. The shallow region formed therein by $BF_2+$ implantation is delimited by the dotted line.

Figure 4H:
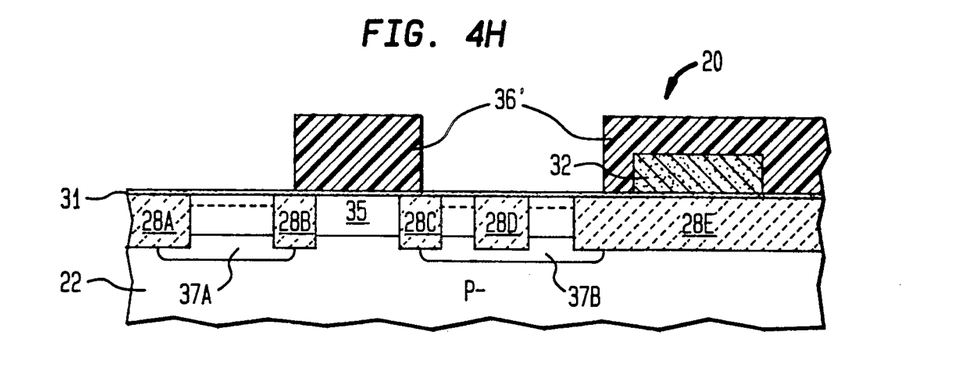

8. The masking layer 34' is removed by ashing in $O_2$ in a BRANSON 3300 tool, and the wafer is cleaned. A new 1.1 μm thick photoresist layer 36 is applied onto the structure, exposed and developed to define insitu mask 36'. Likewise, boron ions B+ are then implanted in two steps. The first shallow implantation step (dose: 1.6E12 at/$cm^2$, energy: 90 KeV) aims at limiting punch-through damages at the surface (see the dotted line near the wafer surface in FIG. 4H). The second deep implantation (dose: 2E12 at/$cm^2$, energy: 195 KeV) creates the field regions 37A, . . . that prevents undesired shorts between the N+ regions formed into the epitaxial layer 22 whereat NFETs are to be subsequently formed. The resulting structure is shown in FIG. 4H. For sake of simplicity, field regions 37A, . . . will no longer be represented in the following drawings.

Figure 4I:
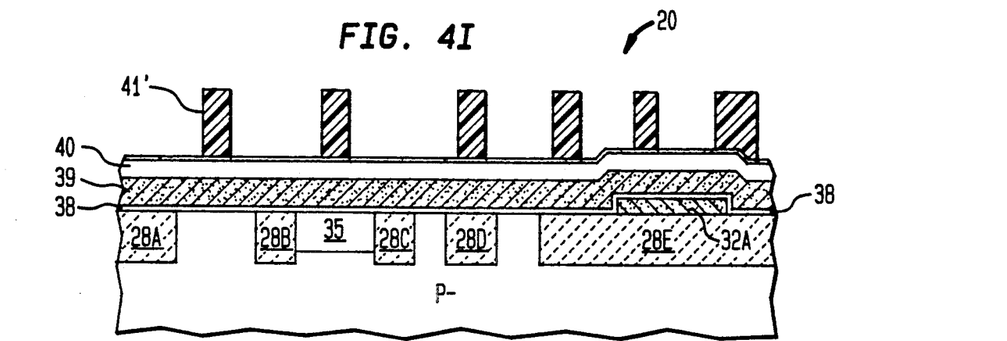
Figure 4J:
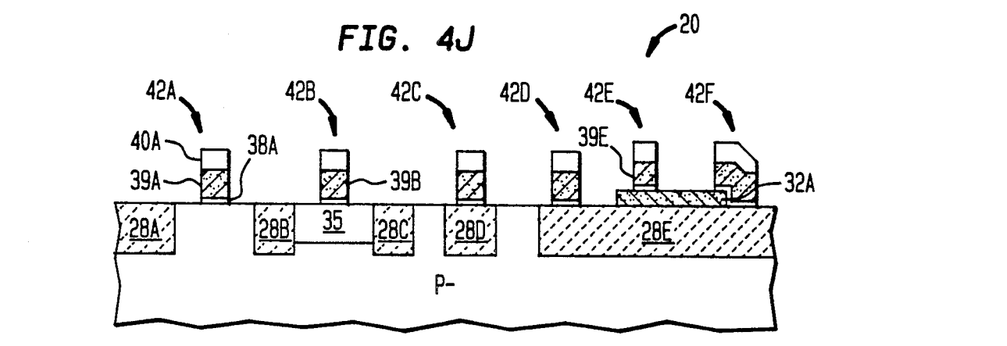

9. Next, the resist mask 36' is removed by ashing and the wafer is cleaned as previously mentioned. Then, the wafer is dipped in diluted HF (10:1) to strip off the sacrificial $SiO_2$ layer 31 everywhere except under the polysilicon land 32A. The remaining portion of $SiO_2$ layer 31 which lies above TEOS oxide filled island 28E and beneath polysilicon land 32A will no longer be represented in the drawings. The wafer is now thermally oxidized at 800° C., so that a 10 nm thick $SiO_2$ insulating layer 38 is grown over the structure. It will be subsequently used as the gate dielectric of the bulk FET and pPFET devices. The process continues with the deposition of a base 2300 nm thick intrinsic polysilicon layer by LPCVD. A tungsten silicide (WSix) layer with a thickness of about 250 nm is then formed thereupon in a GENUS CVD equipment. This composite layer is referenced 39 in FIG. 4I. Instead of WSix, a 250 nm thick titanium disilicide ($TiSi_2$) may be deposited using VARIAN sputter equipment. Optionally, a top polysilicon layer (not represented) could be blanket deposited onto the structure in a LPCVD equipment to reach a thickness of about 30 nm. Phosphorous ions are implanted in layer 39 in an AME PI 9200 equipment. This step aims at making the polysilicon material of layer 39 that will subsequently form the conductors and the gate electrodes of bulk FET and pFET devices conductive. A 400 nm thick cap TEOS layer 40 is then deposited onto the structure by LPCVD. The structure is annealed at 950° C. (800° C. for the $TiSi_2$ option). Finally, a 1.1 μm thick photoresist layer 41 is applied, exposed and developed to leave mask 41'. The resulting structure is shown in FIG. 4I.

10. Using mask 41', the structure is subjected to RIE etching in a $CHF_3/Cl_2/O_2$ atmosphere to remove the exposed zones of the cap TEOS layer 40 and the composite polysilicon/WSix underlying layer 39. $SiO_2$ layer 38 acts as the etch-stop layer for this step. The wafer is first cleaned in diluted HF (10:1) which eliminates the exposed portions of layer 38, and then in a sulfuric acid/peroxide solution. As apparent from FIG. 4J, a plurality of lines, generically referenced 42, remain onto the structure at this stage of the process. For example, line 42A comprises a bottom oxide pad 38A, a polysilicon plug 39A, and a top TEOS capping 40A. These oxide sandwiched polysilicon plugs 39A, . . . will subsequently form the gate electrodes of bulk FET and pPFET devices and conductors as well.

Figure 4K:
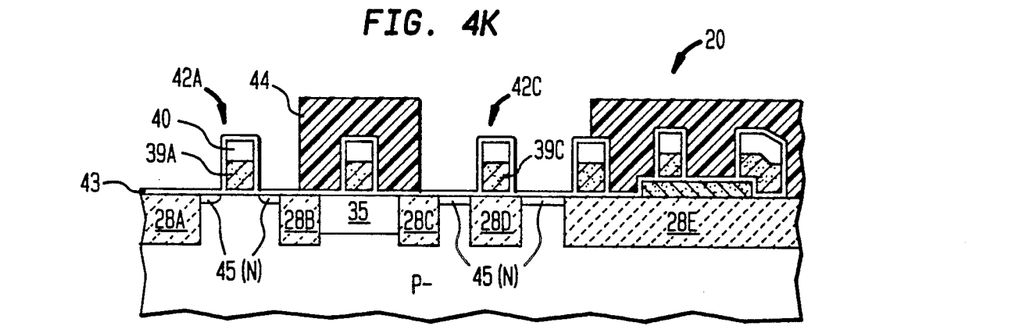

11. In the next step, the N-LDD regions for bulk NFETs are constructed. First, oxide sidewalls are formed on the remaining polysilicon/WSix lines 39A, . . . To that end, a 34 nm thick TEOS layer 43 is blanket deposited onto the structure. Next, the structure is oxidized at 900° C. (800° C. for the $TiSi_2$ option) to increase the thickness of the oxide coating the sidewalls of the lines. This thermal step also results in the annealing of the polysilicon plugs. Next, a 1 μm thick photoresist layer 44 is patterned as standard to leave mask 44', as illustrated by FIG. 4K. A dual ion implantation step is conducted, first with arsenic As+ ions (90 KeV, 2E14 at/cm2), then with phosphorous P+ ions (45 Kev, 3E13 at/cm2), to create the N-LDD regions 45 in FIG. 4K.

Figure 4L:
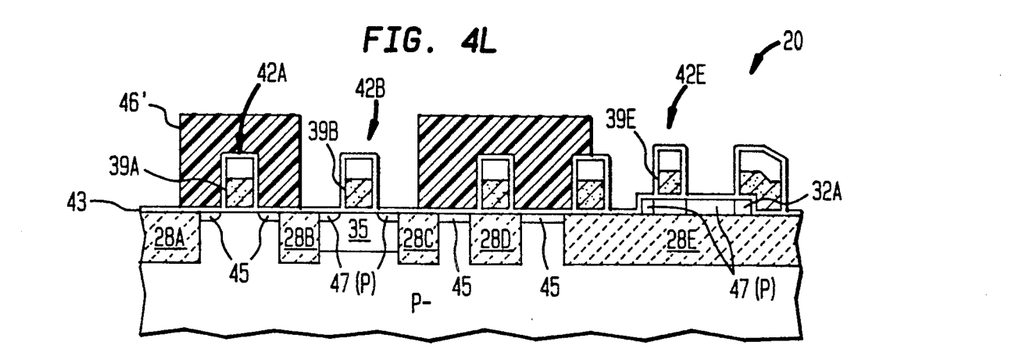

12. Next, the P-LDD regions are formed. Similarly, a new photoresist layer 46 is patterned to provide a mask 46'. P-LDD regions 47 are then created in both the bulk PFET and pPFET devices by implanting boron ions B+ (12 keV, 1.4E14). The structure at this stage of the process is shown in FIG. 4L (the hatchings in land 32a have been removed for sake of illustration). Mask 46' is eliminated by ashing and the wafer cleaned as previously described.

Figure 4M:
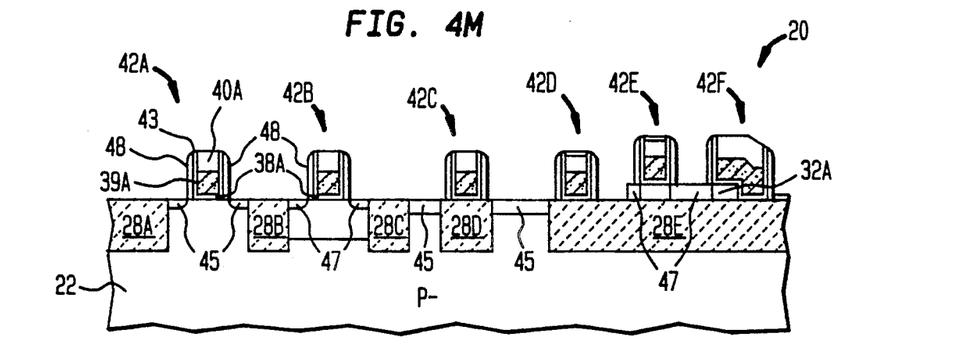

13. A 200 nm thick TEOS layer 48 is conformally deposited onto the structure 20, and RIE is etched anisotropically, leaving 130 nm thick vertical portions or spacers 48 on the $SiO_2$ sidewalls previously formed (in step 11). The structure is annealed at 900° C. (RTA for $TiSi_2$). The resulting structure is shown in FIG. 4M, wherein it is apparent that polysilicon plugs appear as oxide encapsulated. For instance, polysilicon plug 39A is isolated from the major wafer surface by the thin dielectric layer 38A. TEOS pad 40A ensures capping, while the remaining portion of dual oxide layer 43/48 ensures lateral coating.

Figure 4N:
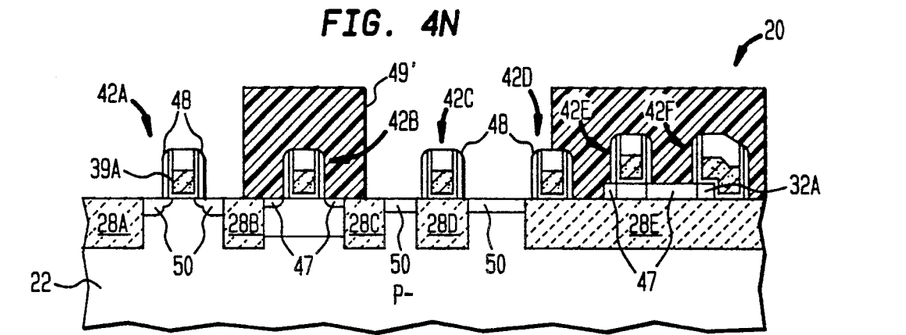

14. $N^+$ source and drain regions of bulk NFETs are now formed. A 1 μm thick photoresist layer 49 is applied onto the structure, exposed and developed to provide mask 49' (mask 49' is identical to mask 44'). Arsenic ions $As+$ are then implanted (dose: 2E15 at/cm$^2$; energy: 80 KeV) to form the the bulk NFET $N^+$ source and drain regions 50 (including the N-LDD regions formed previously). These are illustrated in FIG. 4N, on both sides of line 42A.

Figure 4O:
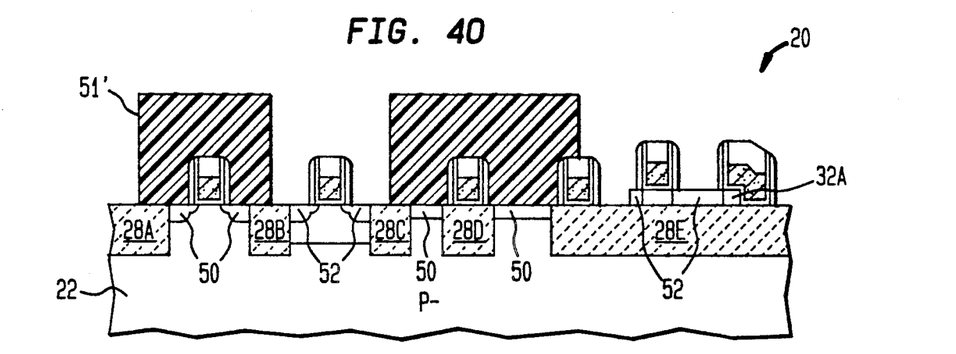
Figure 4P:
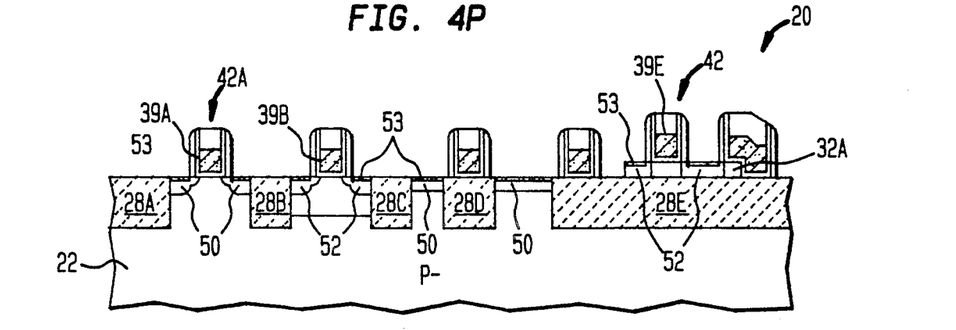

15. In a similar manner, as illustrated in FIG. 4O, $P+$ source and drain regions 52 (including the P-LDD regions formed previously) of bulk PFETs and pPFETs are formed after formation of resist mask 51'. This step concludes with a rapid activation anneal (RTA) of the structure completed at 800° C.

16. The wafer is cleaned and titanium (Ti) is sputter deposited to form a blanket 40 nm thick Ti layer 53. The structure is then sintered by rapid thermal processing (RTP) at 675° C. which causes $TiSi_2$ formation at the Ti/Si interface. Next, the titanium that had not reacted is removed by dipping the wafer in a Huang A solution. The $TiSi_2$ regions, formed during this step, are referenced 53 in FIG. 4P. The process continues with the steps required to form the metallization.

Figure 4Q:
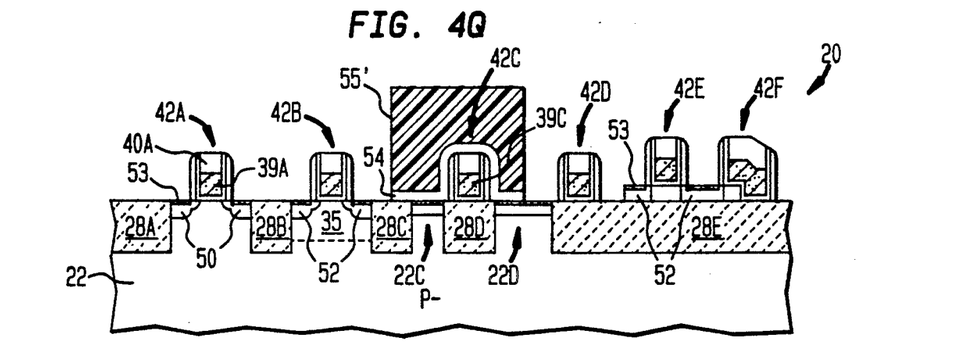

17. Referring now to FIG. 4Q, a 100 nm thick TEOS layer 54 is blanket deposited onto the structure. A 0.6 μm thick photoresist layer 55 is then applied onto the structure, exposed and developed to form mask 55'. The structure is then subjected to etching using a $CHF_3/O_2$ gas mixture. As a result, the exposed areas of TEOS layer 54 are etched. This layer 54 is useful above some regions of the epitaxial layer 22, e.g., in region 22C, to define the overpass conductors that will be subsequently formed. As illustrated in FIG. 4Q, mask 55' only partially covers region 22D, but it could have fully covered it as well. In the present instance, the overpass conductor connects the gate electrode consisting of plug 39C in line 42C with a source/drain region 52 of the bulk PFET formed in the N-well 35, as will be explained hereinafter. Finally, mask 55' is stripped by ashing in $O_2$ and the wafer is cleaned. Note that if no overpass conductors are required, masking step 17 will not be necessary.

Figure 4R:
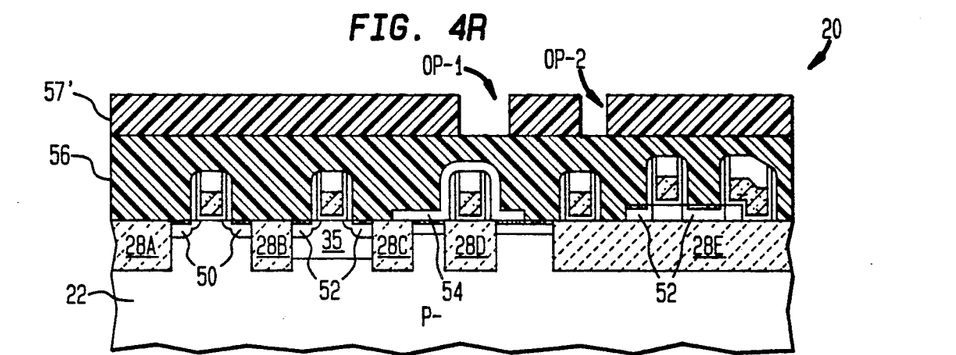

18. A multilayer resist mask defining the contacts to polysilicon gate electrodes is now formed. A first 1 μm thick photoresist layer 56 is formed onto the structure of FIG. 4Q, and baked at 200° C. for hardening. This step inhibits the photoactive properties of layer 56. A second 0.6 μm thick photoresist layer 57 is then deposited thereupon. The top photoresist layer 57 is exposed and developed to form mask 57'. The structure thus obtained is shown in FIG. 4R. Two openings, referenced OP-1 and OP-2, illustrate the way of contacting oxide capped polysilicon gate electrodes in lines 42C and 42D. These are used in the overpass conductor structure mentioned above and, respectively, as a standard gate electrode contact.

Figure 4S:
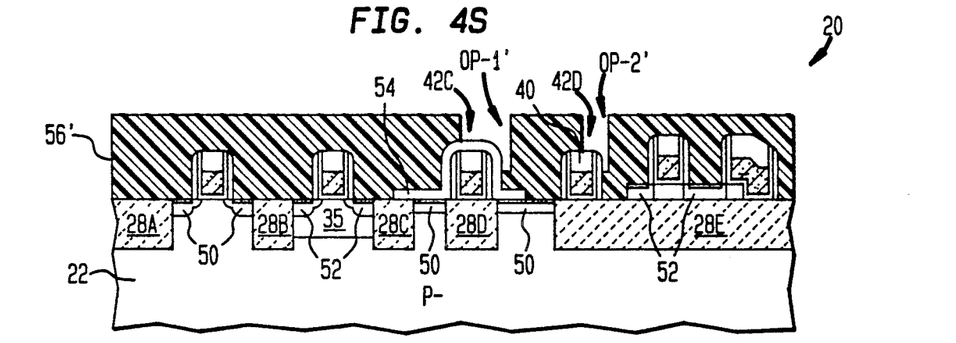

19. The pattern of mask 57' is transferred to the underlying bottom layer 56. The structure is etched using $O_2$. This step fully consumes photoresist mask 57' and results in openings OP-1', . . . The remaining portion of the TEOS oxide layer 54 acts as the etch stop layer in the openings of layer mask 56'. Etch end point is detected by standard emission spectroscopy. The resulting structure at this stage of the process is shown in FIG. 4S.

Figure 4T:
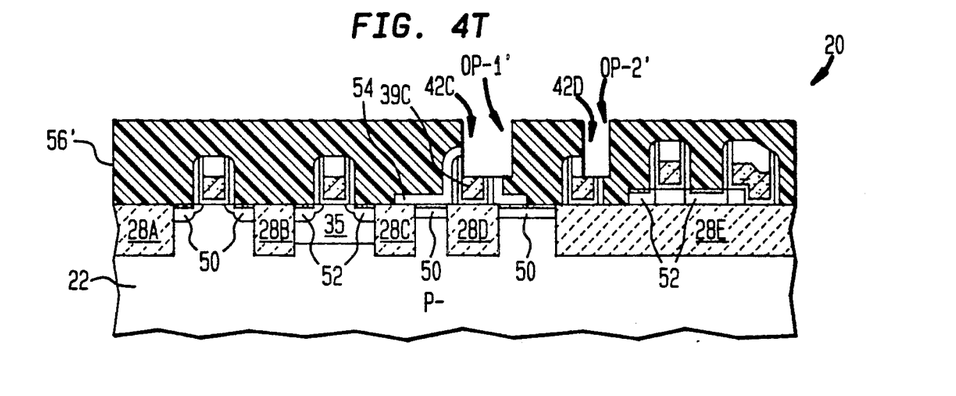

20. The RIE process is next extended for overetching. Referring to FIG. 4T, exposed oxide regions above lines 42C and 42D are etched using layer 56' as a mask in a $CHF_3/O_2$ atmosphere. Using standard emission spectroscopy, the top WSix capping of the composite polysilicon/WSix layer 39 is used as the etch-stop layer for that step.

Figure 4U:
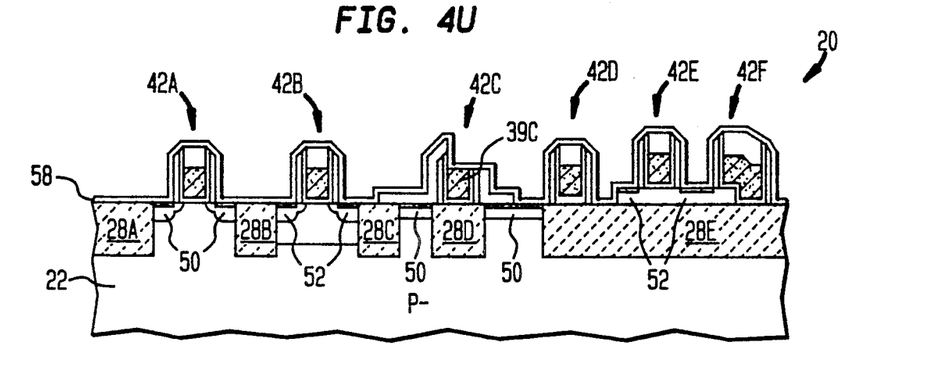
Figure 4V:
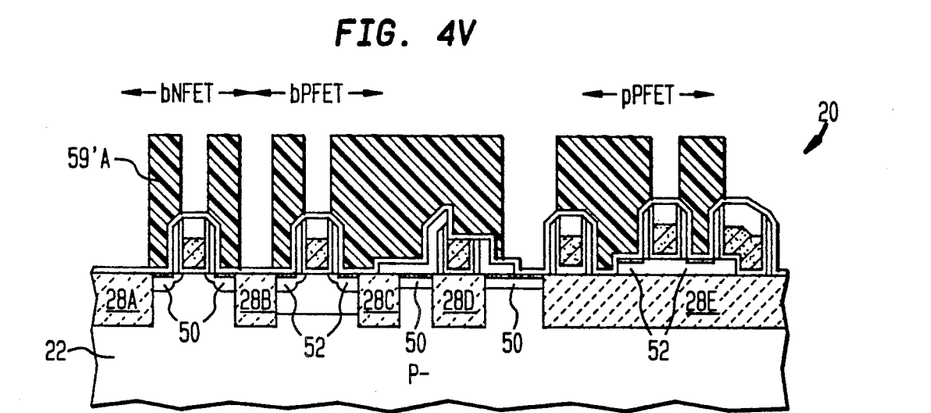

21. Mask 56' is now removed by ashing in $O_2$ and the wafer is cleaned. A thin (e.g., 50 nm) $Si_3N_4$ layer 58 is blanket deposited by PECVD onto the structure, as illustrated in FIG. 4U.

22. The first metal contact studs of MO (or first level) are fabricated in two steps using the so-called "resist plug" method. To that end, a 1.1 μm thick photoresist layer 59 is deposited onto the structure, exposed, developed and hardened to UV light at 240° C. The resulting mask is comprised of a pattern of resist plugs generically referenced 59', in FIG. 4V. These plugs will be the nests of the conductive contact studs to be subsequently formed.

Figure 4W:
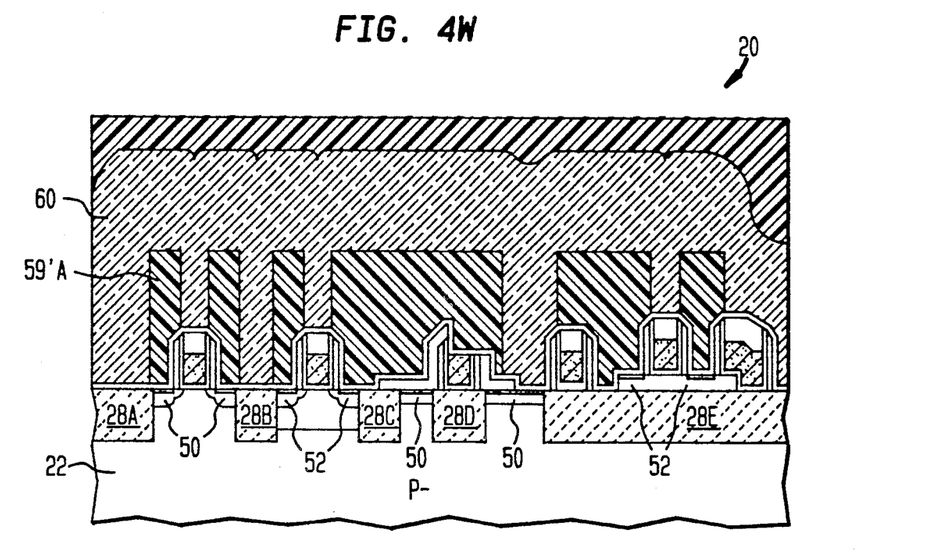

23. The present step aims at defining the PSG filling matrix. A 1000 nm thick PSG layer 60 is deposited onto the structure to fill the space left by the resist plugs 59' with phosphosilicate glass (PSG) at 190° C. A planarizing medium, such as a 0.6 μm thick photoresist layer 61, is formed thereupon and baked at 130° C. The resulting structure is shown in FIG. 4W.

Figure 4X:
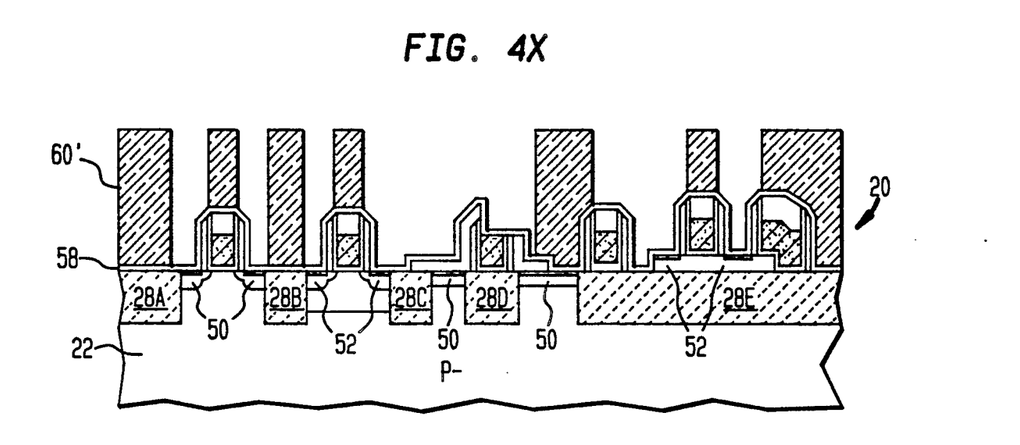

24. The structure is etched-back using a $CHF_3/He/O_2$ mixture which etches both materials, i.e., the PSG of layer 60 and the resist of layer 61, at the same etch rate. Once the top of the resist plugs forming mask 59' is achieved (it is monitored by detecting carbon radiation in a standard emission spectroscopy monitoring apparatus), the process stops. The remaining resist material forming mask 59' is eliminated by ashing in $O_2$, leaving a PSG matrix generically referenced 60' standing over the structure, as illustrated in FIG. 4X. The PSG matrix 60' has a complementary pattern with respect to the pattern of the resist plug 59' which, once eliminated, leaves a corresponding pattern of voids or openings. These will, subsequently, receive the contact studs.

Figure 4Y:
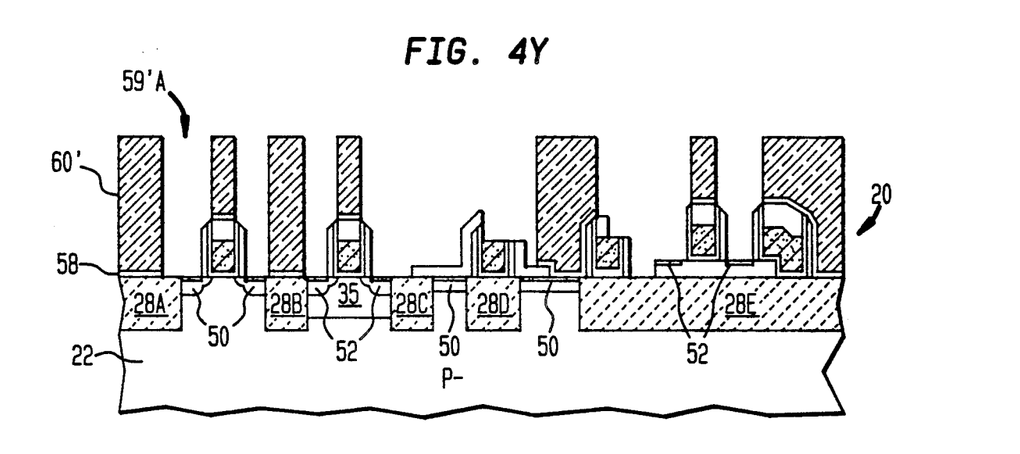

25. The wafer is cleaned and the structure is annealed at 760° C. during 60 mn. Next, the exposed portions of the $Si_3N_4$ layer 58 are eliminated by RIE using SF6. Since layer 58 is much thinner than the PSG matrix 60', the latter becomes eroded. The structure is annealed again at 600° C. during 30 mn. The resulting structure with adequate contact stud openings for further processing is shown in FIG. 4Y. Contact stud openings (e.g., 59'A) are still referenced as the corresponding resist plugs.

26. The contact stud openings are filled by successive deposition of titanium and titanium nitride TiN layers that are blanket sputtered on the whole wafer to form a composite Ti-TiN layer (referenced 62). The stud openings are then filled with a tungsten layer 63. More details are described in the European patent EP-A-469214, of common assignee. The deposited metal layers are planarized, (e.g., with the technique described in the European Patent EP-A-223920, of common assignee). Planarization of the Ti-TiN and W composite layer produces contact pads 62 and contact studs 63 in stud openings 59'. By way of example, as illustrated in FIG. 4Z, contact pad 62A and contact stud 63A are formed in the contact opening 59'A. This step ends the process of forming the first set of half metal contact studs 63A, ...

Figure 5:
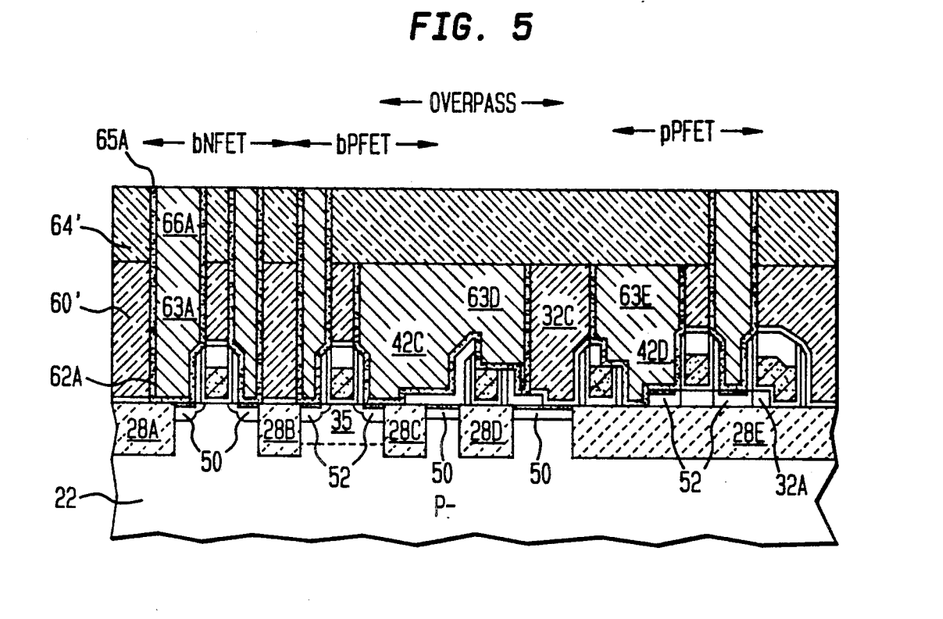
FIG. 5 shows an enlarged view of the structure which includes overpass conductors in accordance with the present invention.

27. Processing steps 22 to 26 are repeated to provide the other halves of the metal contact studs. FIG. 5 shows the structure 20 at the end of the MO level with the first metal contact studs completed. These steps result in the formation of a PSG matrix 64' with contact pads and contact studs, generically referenced 65 and 66, respectively, embedded therein. The structures of P and N type bulk FET devices referred to as bNFET at bPFET and pPFET devices are illustrated in FIG. 5. The overpass conductor is referred as 63D. It interconnects an active source/drain region of the bPFET and the gate electrode of an FET (not referenced) corresponding to line 42C. Conductor 63E interconnects an active region of the pPFET and the gate electrode of a FET (not referenced, corresponding to line 42D).

Figure 4Z:
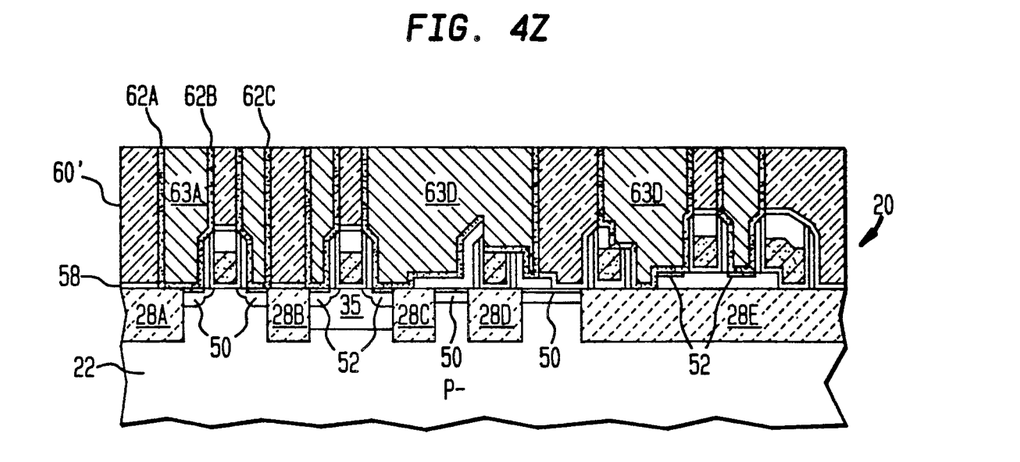
Figure 6:
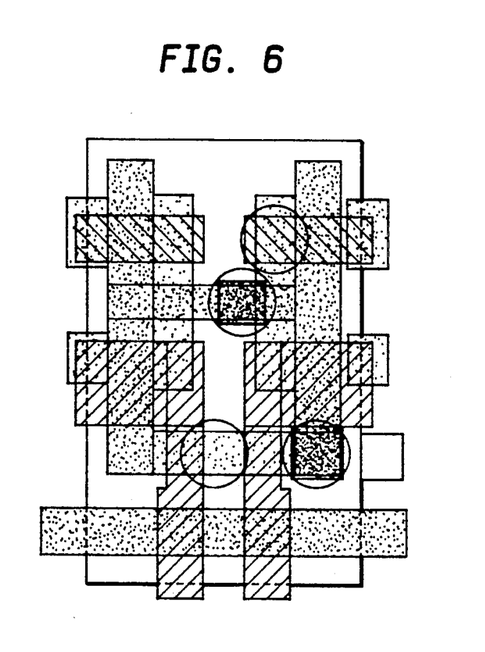
FIG. 6 is a planar view showing a typical layout of a 6D SRAM cell that results from the processing steps described in FIGS. 4A to 4Z, wherein overpass conductors are formed.

FIG. 6 shows the real layout of a 6D-SRAM cell structure obtained according to the present method described in conjunction with FIGS. 4A to 4Z, i.e., using four additional masks with respect to a standard CMOS manufacturing process, which allows the implementation of overpass conductors (e.g., 63D). The cell area is 18.45 μm2.

Figure 7:
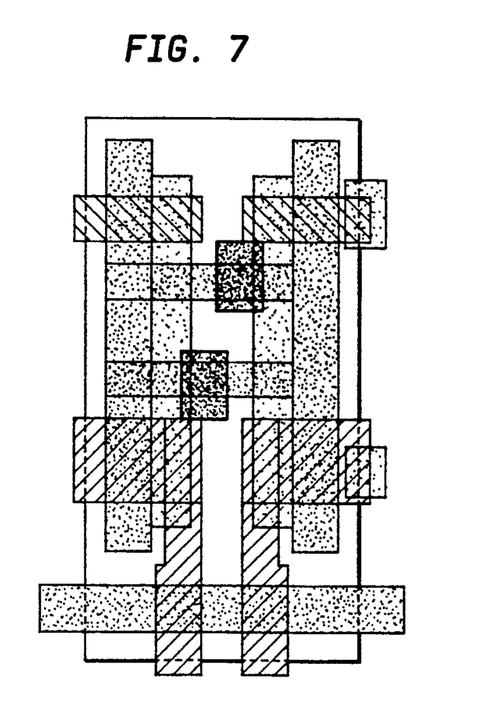
FIG. 7 is a planar view showing another typical layout of a 6D SRAM cell that results from an alternate method in which no overpass conductors are formed.

FIG. 7 shows the layout of a similar structure obtained with an alternate embodiment of the present method, with only three additional masks, i.e., without overpass conductors. There is a slight increase in cell area, now equal to 21 μm2, which demonstrates the usefulness of the overpass conductors (e.g., 63D) as an efficient feature of the interconnection scheme.

To achieve the final structure (not shown), standard first metallization layer is deposited and patterned to leave metal lands at the M1 mask level. The metallization layer may be a Ti/Al-Cu/Si metallurgy. Metal lands are used for the word lines WL, and busses are connected to $V_{CC}$ and Gnd. A normal BEOL process is used until the structure is covered by an insulating film of PECVD oxide.

The steps of depositing a PSG insulating matrix to form metal contact studs and metal lands could be repeated should the chip be of a multilevel type (M2, M3, . . .). However, note that in the upper levels of the structure, $SiO_2$ is preferred over PSG. A planarization step is to be associated to each stud level. The structure fabrication is terminated by completing the terminal metallurgy steps including forming the contact pads of the Ball Limiting Metallurgy (BLM) and contact terminals (e.g., solder balls) as widely described in the literature.

In order to increase the channel mobility and decrease the threshold voltage VT of the pPFETs, hydrogen passivation of the dangling bonds is required. It helps minimize the effects of the grain boundary potential barriers on device performance. This step, known in the art as the "forming gas anneal step", is completed in a furnace at 400° C. during 30 mn, in a $N_2/H_2$ forming gas. This step is performed after deposition of polysilicon layer 32. It can be repeated several times during the BEOL process or at any subsequent level to improve quality of the structure.

In essence, a method of building pseudo-planar thin-film polysilicon gate PFETs (pPFETs) as load devices in a CMOS process is described. In the standard planar 6D SRAM cells, the PFETs used as load devices require large areas (due to the N-well regions for appropriate isolation) and are fabricated simultaneously with the bulk FET devices. In contradistinction, according to the present invention, the pPFETs are of a thin-film type to increase integration density and are fabricated early in the CMOS process flow, preferably, prior to any process step necessary to fabricate the bulk FET devices.

The main advantages of the method of the present invention are summarized hereinafter:

I. It provides additional flexibility to the thermal treatment of the body of the pPFETs, since there are no longer any temperature constraints in view that no bulk FET device is formed at this stage. This is a distinct advantage, since the recrystallization of the amorphous polysilicon forming the body is an important step to enlarge its grain size which results in an improved performance of pPFET devices.

II. It is compatible with an N-well process as well as with a P-well process, i.e., with standard CMOS processes.

III. Its process complexity and cost are lowered due to the many common steps that exist between the fabrication of the bulk NFETs and PFET devices on the one hand, and the pPFETs, on the other:
- the same polysilicon/WSix layer 39 is used for forming the gate electrodes of all FET devices regardless they are bulk FET or pPFET devices;
- the same polysilicon gate anneal step;
- the same TEOS deposition step for forming the oxide spacers;
- the same source/drain implantation steps for both bulk FETs and pPFETs;
- the same source/drain activation anneal; and
- the same silicidation steps. In view of all these common steps, it is clear that the pPFETs can benefit of all the engineering done for the bulk FET devices, such as the source/drain engineering and the self-alignment technique. Since the steps of forming the pPFETs and bulk FETs are independent, improvements to any of these can be done without impacting the others. This advantage is important since the present process permits the implant of source/drain regions far away from the channel regions. Thus, LDD structures can be achieved in the pPFETs. In spite of a faster dopant diffusion in polysilicon than in silicon, a short channel length is nevertheless achievable in the pPFETs. In addition, self-alignment also helps in precisely defining the channel length of the pPFETs.

IV. It provides an efficient local interconnect scheme including overpass conductors.

V. The spacing between the pPFETs and the bulk NFETs, when compared to a 6 Device SRAM cell manufactured by a conventional CMOS method, is much reduced with respect to a standard CMOS process.

VI. pPFETs become quasi immune to SER (Soft Error Rate). Since the pPFET is formed on top of an isolation region (e.g., 28E), the SER is lowered.

VII. pPFET source/drain regions of all FET devices and gate electrodes thereof are silicided without an extra processing step.

The present invention leads to a structure intermediate between a planar device and a completely stacked device. It provides a solution to satisfy the requirements of a 4Mb Industry Standard SRAM chip, since dense and high performance PFETs are used as load devices. Another obvious applications of the present method can be found in SRAM macros. Moreover, for logic applications, where efficient local interconnect scheme are required, the present method also meets such needs.

What is claimed is:

1. A method of forming thin film pseudo-planar polysilicon gate PFETs, pPFETs, simultaneously with bulk PFET and NFET devices in a CMOS or BiCMOS semiconductor structure, comprising the steps of:
   a) providing a P-type silicon substrate having a surface that includes a plurality of isolation regions;
   b) delineating polysilicon lands at selected of said isolation regions;
   c) forming N-well regions into the substrate at a location where bulk PFETs are to be subsequently formed;
   d) forming insulator encapsulated conductive polysilicon studs to provide gate electrodes at selected locations of the structure;
   e) forming self-aligned source/drain regions of the bulk NFETs into the substrate;
   f) forming self-aligned source/drain regions of the bulk PFETs and pPFETs into the substrate and into the polysilicon lands, respectively; and
   g) forming contact regions to the selected locations that include the source/drain regions.

2. The method of claim 1 further comprising the step of:
   h) forming an etch stop layer over selected polysilicon studs and selected regions of the substrate to facilitate subsequent formation of overpass conductors.

3. The method of claim 1 or 2 further comprising the step of:
   i) exposing the top of selected polysilicon studs 4. The method of claims 1 or 2 further comprising the steps of:
   j) blanket depositing an etch stop layer onto the structure;
   k) forming an insulating matrix provided with openings onto the structure, thereby exposing desired locations of the underlying etch stop layer;
   l) etching the exposed regions of the etch stop layer; and
   m) filling the openings of the matrix with conductive material to form contact studs.

5. The method of claim 1, wherein the step b) of delineating a polysilicon land further comprises the steps of:
   n) sequentially blanket depositing a thin sacrificial layer and a polysilicon layer; and
   o) patterning the polysilicon layer to form the polysilicon land.

6. The method of claim 5 further comprising the step of:
   p) recrystallizing the polysilicon land.

7. The method of claims 5 or 6 wherein the step d) of forming the polysilicon studs further comprises the steps of:
   q) selectively removing the thin sacrificial layer followed by blanket depositing a thin dielectric layer;
   r) sequentially blanket depositing a polysilicon layer and a WSix layer to form a composite conductive layer;
   s) blanket depositing a cap insulating layer; and
   t) patterning the dual insulating cap/composite layer.

8. The method of claims 1, 5, or 6 further comprising prior to step e) the steps of:
   u) oxidizing the lateral sides of the polysilicon studs to form oxide sidewalls thereon;
   v) implanting ions to selectively create P-LDD regions in the substrate at the bulk NFET locations;
   w) implanting ions to selectively create N-LDD regions in N-well regions at the bulk PFET locations; and
   x) forming etch stop insulator sidewalls (48) on the polysilicon studs.

* * * * *